United States Patent
Curtis, III et al.

(10) Patent No.: US 6,359,944 B1
(45) Date of Patent: Mar. 19, 2002

(54) TUNING SYSTEM FOR ACHIEVING QUICK ACQUISITION TIMES FOR A DIGITAL SATELLITE RECEIVER

(75) Inventors: John Joseph Curtis, III, Noblesville, IN (US); John Zoltan Bohach, Meridian, ID (US)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 09/155,025

(22) PCT Filed: Apr. 4, 1997

(86) PCT No.: PCT/US97/05667

§ 371 Date: May 10, 1999

§ 102(e) Date: May 10, 1999

(87) PCT Pub. No.: WO97/38489

PCT Pub. Date: Oct. 16, 1997

(30) Foreign Application Priority Data

Apr. 17, 1996 (GB) .............................. 9607918

(51) Int. Cl.$^7$ ................................. H03J 5/02
(52) U.S. Cl. ................. 375/344; 375/326; 375/339; 455/257; 455/255
(58) Field of Search ............................ 375/316, 339, 375/151, 153, 136, 365, 326, 344; 455/193.1, 196.1, 192.1, 192.2, 255, 257; 329/304, 306, 307

(56) References Cited

U.S. PATENT DOCUMENTS

| | | | | |
|---|---|---|---|---|
| 5,402,449 A | * | 3/1995 | Schultes et al. | 375/329 |
| 5,579,345 A | * | 11/1996 | Kroeger et al. | 375/344 |
| 5,612,977 A | * | 3/1997 | Orogo | 375/344 |
| 5,630,215 A | * | 5/1997 | Waldie et al. | 455/192.2 |
| 5,659,372 A | * | 8/1997 | Patel et al. | 348/731 |
| 5,974,098 A | * | 10/1999 | Tsuda | 375/340 |

FOREIGN PATENT DOCUMENTS

| | | | | |
|---|---|---|---|---|
| EP | 0689324 | | 12/1995 | ............ H04L/27/22 |
| WO | 87/07794 | | 12/1987 | ............ H04B/1/16 |

* cited by examiner

*Primary Examiner*—Chi Pham
*Assistant Examiner*—Dung X. Nguyen
(74) *Attorney, Agent, or Firm*—Joseph S. Tripoli; Kuniyuki Akiyama

(57) ABSTRACT

The RF signals received from the LNB and the corresponding IF signal produced by the tuner may be offset in frequency due to reasons other than a frequency drift of the oscillator of the LNB, such as satellite transponder frequency adjustments made by the satellite transmission system. A tuner (9) includes a local oscillator (911) controlled by a controller. The controller (a) controls the frequency of the local oscillator (911); (b) stores digital nominal frequency representative words for respective ones of RF signals received; (c) stores digital offset representative words for respective ones of the RF signals; (d) determines a frequency offset of said carrier signal after a RF signal has been tuned; (e) updates all of the digital offset representative words in accordance with the frequency offset of the carrier; (f) derives the tuning representative word for an RF signal selected to be tuned by combining said nominal frequency representative word for the RF signal selected to be tuned with the previously updated offset representative word for the RF signal selected to be tuned; and (g) updates the respective digital offset representative word for an individual RF signal presently being tuned if correct tuning is not achieved with the previously updated offset representative word.

13 Claims, 3 Drawing Sheets

TUNING SYSTEM FOR ACHIEVING QUICK ACQUISITION TIMES FOR A DIGITAL SATELLITE RECEIVER

FIELD OF THE INVENTION

The invention concerns a tuning system for a satellite receiver, especially one capable of receiving and processing television signals transmitted in digital form.

BACKGROUND INFORMATION

Satellite television receiving systems usually comprise an "outdoor unit" including a dish-like receiving antenna and a "block" converter, and an "indoor unit" including a tuner and a signal processing section. The block converter converts the entire range ("block") of relatively high frequency RF signals transmitted by a satellite to a more manageable, lower range of frequencies.

In a conventional satellite television transmission system television information is transmitted in analog form and the RF signals transmitted by the satellite are in the C (e.g., 3.7 to 4.2 GHz) and Ku (e.g., 11.7 to 14.2 GHz) bands. The RF signal received from the satellite by the antenna of the receiving system are converted by the block converter to the L band (e.g., 900 to 2000 MHz). An RF filter section of the tuner of the indoor unit selects the one of the RF signals received from the block converter corresponding to the selected channel, and a mixer/local oscillator section of the tuner converts the selected RF signal to a lower, intermediate frequency (IF) range for filtering and demodulation.

In newer satellite television systems, such as the DirecTv™ operated by the Hughes Corporation of California, television information is transmitted in digital form. The RF signals are transmitted by the satellite in the Ku band, and are converted by the block converter to the L band. The frequency range of the RF signals transmitted by the satellite is somewhat smaller (e.g., between 12.2 and 12.7 GHz) than that for the analog satellite television system, and the frequency range of RF signals produced by the block converter is accordingly somewhat smaller (e.g., between 950 and 1450 MHz).

As in the analog satellite television receiving systems, the RF signal corresponding to the selected channel has to be reduced in frequency to an IF frequency range for filtering and demodulation. In a digital satellite receiver, in addition to the normal IF filtering for selecting the desired RF signal and rejecting unwanted RF signals, it is desirable that the IF filter perform what is known as "symbol shaping" to reduce decoding errors due to "inter-symbol interference" caused by bandwidth limitations.

The conversion stage of the block converter of the outdoor unit usually includes a local oscillator which is not stabilized against variations of temperature and age. The result is that the frequency of the local oscillator signal of the block converter changes, causing a corresponding change or offset of the frequencies of the carrier signals of the RF signals received by the tuner of the indoor unit. As a consequence, the frequency of the IF signal produced by the tuner also changes or is offset from its nominal value. If the frequency of the IF signal changes too far from its nominal value, the digital signals modulated on the IF signal cannot be properly demodulated and the information they represent cannot be properly reconstructed. To overcome this problem, the offset frequency is monitored and an offset added to nominal frequency command to change the local oscillator of the tuner to center the signal in the IF filter.

SUMMARY

Part of the invention resides in the recognition that the RF signals received from the LNB and the corresponding IF signal produced by the tuner may be offset in frequency due to reasons other than a frequency drift of the oscillator of the LNB. More specifically, satellite transponder frequency adjustments may be made by the satellite transmission system operator to reduce the possibility of interference between carrier signals. By way of example, a transponder frequency may be changed by as much as +/−2 MHz. The transponder frequency adjustments cause the RF signals received from the LNB and the corresponding IF signal produced by the tuner to have a frequency offset.

The present invention concerns provisions for tuning frequency offsets due to the adjustment of individual transponder frequencies by the satellite transmission system operator. These provisions allow the transmission frequencies of the transponders to be adjusted by the satellite transmission system operator without unduly increasing the time for the indoor unit to acquire the digital signal when a new channel is selected. Briefly, the tuning system measures and stores individual transponder originated frequency offsets Any offset due to LNB frequency drift is added to all of the transponder frequency offsets as a "global" offset. An individual transponder offset is updated if it is not possible to tune a transponder frequency or if the successful acquisition required a frequency offset greater than a predetermined threshold or is a broad frequency search was required to acquire the signal. These and other aspects of the transponder frequency offset provisions are described below.

These and other aspects of the invention will be described in detail with reference to the accompanying Drawing.

BRIEF DESCRIPTION OF THE DRAWINGS

In the Drawing.

In the various Figures, the same or similar reference designations are used to identify the same or similar elements.

DESCRIPTION OF THE PREFERRED EMBODIMENT

The invention will be described with reference to a digital satellite television system in which television information is transmitted in encoded and compressed form in accordance with a predetermined digital compression standard, such as MPEG. MPEG is an international standard for the coded representation of moving picture and associated audio information developed by the Motion Pictures Expert Group. The DirecTv# satellite television transmission system operated by the Hughes Corporation of California is such a digital satellite television transmission system.

In the transmitter, the television information is digitized, compressed and organized into a series or stream of data packets corresponding to respective video, audio, and data portions of the television information. The digital data is modulated on to a RF carrier signal in what is known as QPSK (Quaternary Phase Shift Keying) modulation and the RF signal is transmitted to a satellite in earth orbit, from which it is retransmitted back to the earth. In QPSK modulation, the phases of two quadrature phase signals, I and Q, are controlled in response to the bits of respective digital data streams. For example, the phase is set to 0 degrees (°) in response to a low logic level ("0"), and the phase is set to 180° in response to a high logic level ("1"). The phase shift modulated I and Q signals are combined and the result transmitted as a QPSK modulated RF carrier signal. Accordingly, each symbol of the modulated QPSK carrier indicates one of four logic states, i.e., 00, 01, 10 and 11.

A satellite typically includes a number of transponders for receiving and retransmitting respective modulated RF carriers. In a conventional terrestrial television system, each RF carrier or "channel" contains information for only one television program at a time. Accordingly, to view a program, only the corresponding RF signal needs to be selected. In a digital satellite television system, each modulated RF carrier carries information for several programs simultaneously. Each program corresponds to groups of video and audio packets which are identified by a unique header appended to the packets which identifies the program. Accordingly, to view a program, both the corresponding RF signal and the corresponding packets need to be selected.

Figure 1:
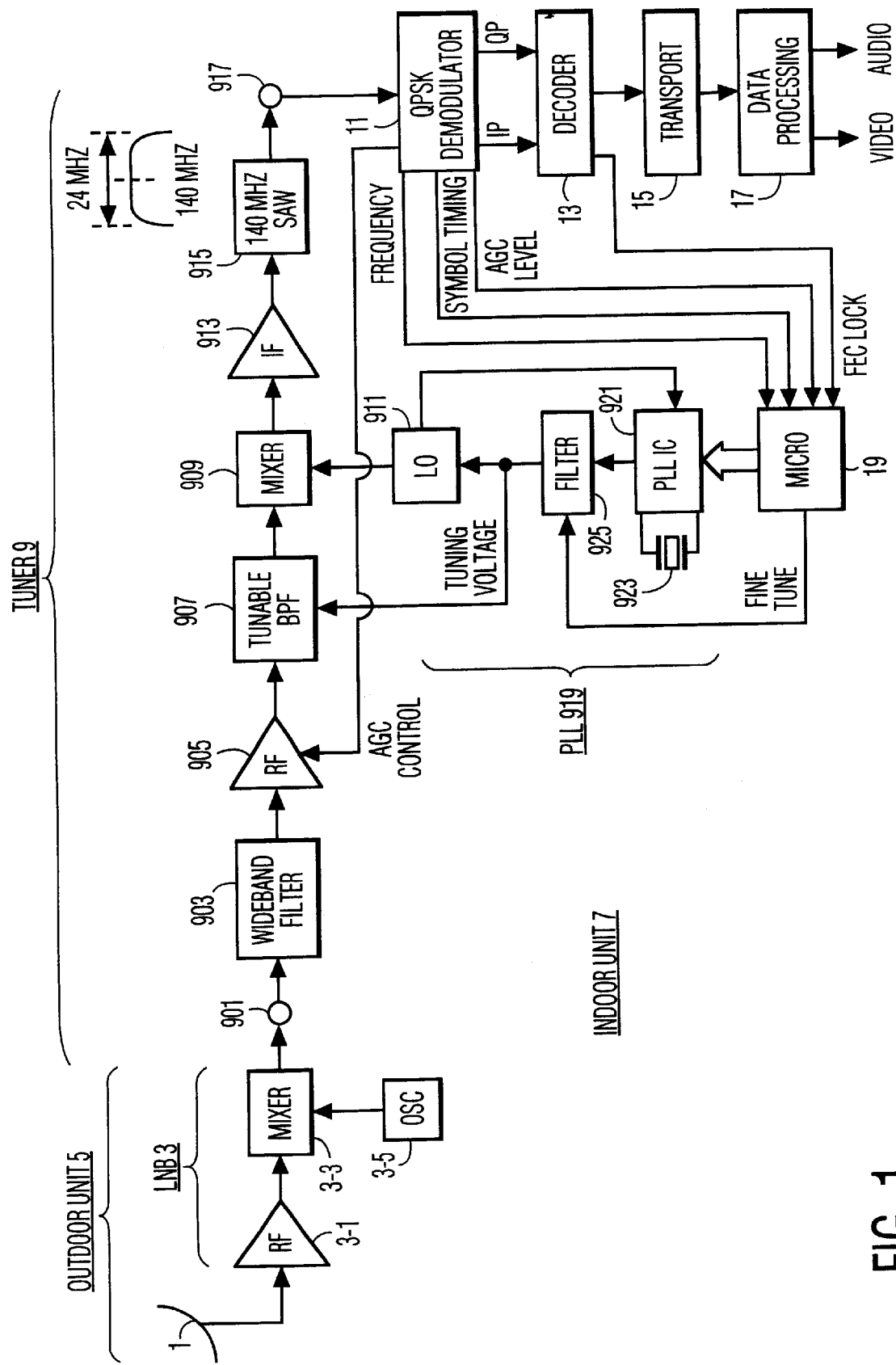
FIG. 1 is a block diagram of a digital satellite television receiver including a tuning system which may utilize the invention.

In the digital satellite television receiver shown in FIG. 1, RF signals modulated with digital signals representing video and audio information which have been transmitted by a satellite (not shown) are received by a dish-like antenna 1. The relatively high frequency received RF signals (e.g., in the Ku frequency range between 12.2 and 12.7 GHz) are converted by a block converter 3, including a RF amplifier 3-1, a mixer 3-3 and an oscillator 3-5, to relatively a lower frequency RF signals (e.g., in the L band between 950 and 1450 MHz). Amplifier 3-1 is a "low noise" amplifier and is therefore block converter 3 is often referred to by the initials "LNB" for "low noise block converter". Antenna 1 and LNB 3 are included in a so called "outdoor unit" 5 of the receiving system. The remaining portion of the receiver is included in a so called "indoor unit" 7.

Indoor unit 7 includes tuner 9 for selecting the RF signal which contains the packets for the desired program from the plurality of RF signals received from outdoor unit 5 and for converting the selected RF signal to a corresponding lower, intermediate frequency (IF) signal. The present invention is concerned with controlling of tuner 9 and will be described in detail below.

The remaining portion of indoor unit 7 demodulates, decodes and decompresses the digital information carried in QPSK modulation form by the IF signal to produce streams of digital video and audio samples corresponding to the desired program, and, thereafter, converts the digital sample streams to respective analog video and audio signals suitable for reproduction or recording. More specifically, a QPSK demodulation 11 demodulates the IF signal to produce two pulse signals IP and QP which contain respective streams of data bits corresponding to the data represented by the phase shift modulated I and Q signals generated in the transmitter. A decoder 13 organizes the bits of the IP and QP signals into data blocks, corrects transmission errors in the data blocks based on error codes which have been embed in the transmitted data at the transmitter, and reproduces the transmitted. MPEG video and audio packets. The video and audio packets are routed by a transport unit 15 to respective video and audio sections of a data processing unit 17 where they are decompressed and converted to respective analog signals. A microprocessor 19 controls the operation of various sections of indoor unit 7. However, only the control signals generated and received by microprocessor 19 with which the invention is directly concerned are indicated in FIG. 1.

The digital satellite television receiver described so far is similar to the RCA™ type DSS™ digital satellite system television receiver commercially available from Thomson Consumer Electronics, Inc. of Indianapolis, Ind..

As noted earlier the present invention is concerned with the controlling of tuner 9 and demodulation. Tuner 9 receives the RF signal provided by LNB 3 at an input 901. The RF input signals are filtered by wideband filter 903, amplified by RF amplifier 905, and filtered by tunable bandpass filter 907. Tunable bandpass filter (BPF) 907 selects the desired RF signal and rejects unwanted RF signals. The resultant RF signal is coupled to a first input of mixer 909. A local oscillator signal produced by local oscillator (LO) 911 is coupled to a second input of mixer 909. The output of mixer 909 is amplified by amplifier 913 and coupled to the input of IF filter 915 comprising a SAW device. The output of IF filter 915 is coupled to output 917 of tuner 9.

The frequency of LO 911 is controlled by phase locked loop (PLL) arrangement 919 comprising PLL integrated circuit (IC) 921, external frequency reference crystal 923 and external filter network 925. The frequency of the LO signal is controlled by PLL 919 in accordance with instructions generated by microprocessor 19.

The carriers of the RF signals transmitted by the satellite and received by antenna 1 have very stable frequencies which remain at "nominal" values. Therefore, as long as the frequency of oscillator 3-5 of LNB 3 is stable and remains at its nominal value, the frequencies of carriers of the RF signals received by tuner 9 of indoor unit 7 will be at their nominal values. Unfortunately, the frequency of oscillator 3-5 can change with time and temperature. The frequency offset of the oscillator 3-5 with respect to its nominal frequency cause corresponding offsets of carrier frequencies of the RF signals received by tuner 9. To compensate for these frequency offsets, the frequency of LO 911 of tuner 9 is changed under the control of microprocessor 19 in response to frequency status information received from QPSK demodulation 11.

Figure 2:
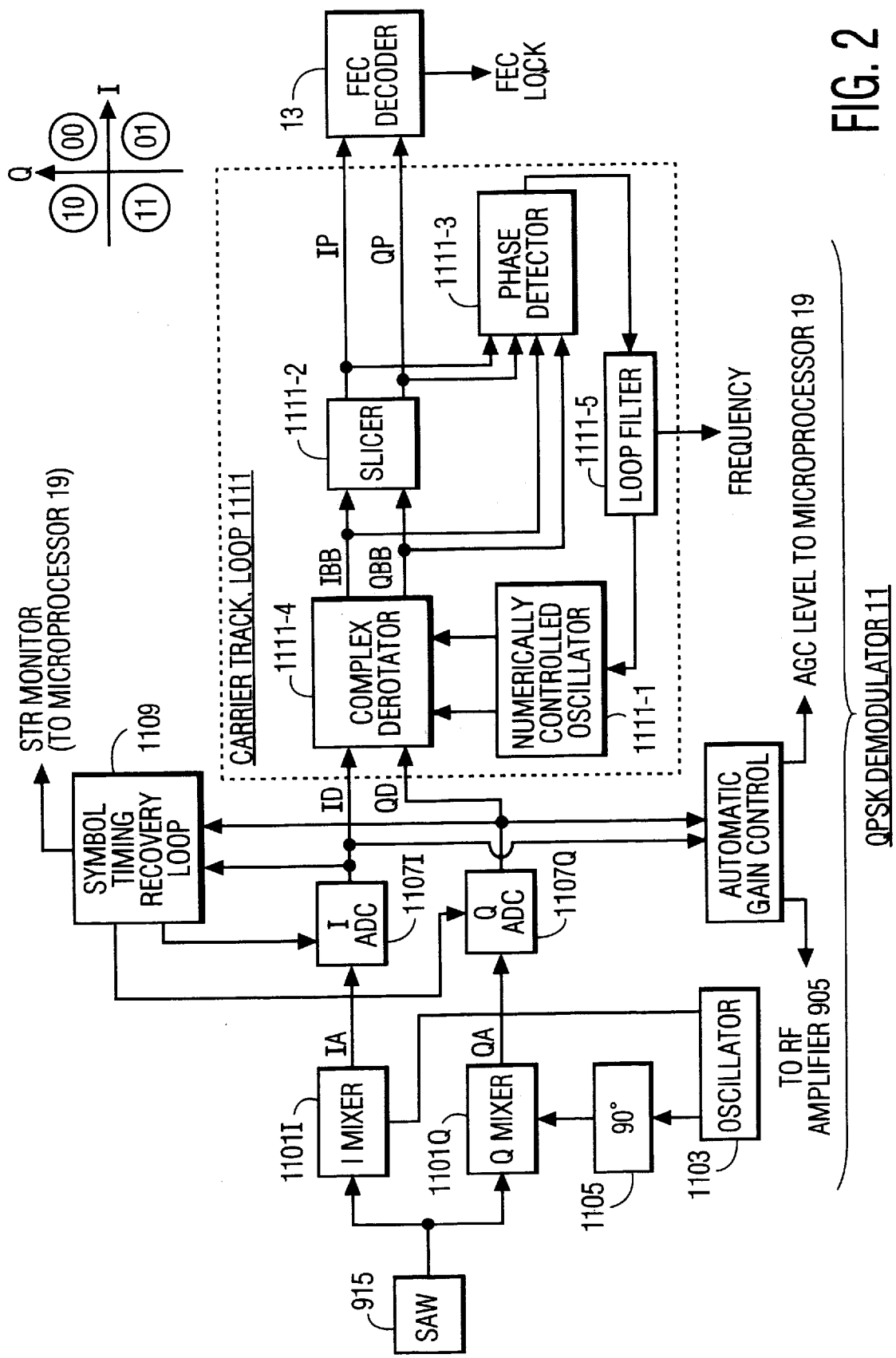
FIG. 2 is a block diagram of a digital data demodulation for use in the satellite receiver shown in FIG. 1 and useful in understanding the recovery of digital date from the tuning system shown in FIG. 1.

As shown in FIG. 2, the IF signal produced by IF SAW filter 915 is coupled to respective first inputs of mixers 1101I and 1101Q. The letters "I" and "Q" signify "in-phase" and "quadrature". The output signal of relatively stable frequency oscillator 1103 is directly coupled to mixer 1101I and indirectly coupled to mixer 1101Q via 90 degree (90°) phase shift network 1105. Mixer 1101I produces an "in-phase", "near" baseband (much lower frequency) version (IA) of the IF signal, while mixer 1101Q produces an "quadrature", near baseband version (QA) of the IF signal, which is shifted 90 degrees with respect to the "in-phase" signal (IA). The letter "A" signifies "analog".

The IA and QA signals are coupled to respective analog-to-digital converters (ADCs) 1107I and 1107Q. Analog-to-digital converters 1107I and 1107Q also receive a clock signal from "symbol timing recovery loop" 1109 and produce respective series of digital samples ID and QD. The letter "D" signifies "digital". Symbol timing recovery (STR) loop 1109 includes a controlled oscillator (not shown) from which the clock signal for ADCs 1107I and 1107Q is derived. The controlled oscillator is controlled by a hybrid (part digital and part analog) phase locked loop (not shown) so that the digital samples are synchronized with the incoming symbol rate and phase. The analog signals can be viewed as a stream of pulses. The function of STR loop 1109 is to phase lock the clock so that the ADC samples the analog signal at the peaks of the pulses. In other words, STR loop 1109 synchronizes the sampling operation of ADCs 1107I and 1107Q with the arrival of each received symbol.

The ID and QD signals are also processed by a "carrier track loop" (CTL) 1111. CTL 1111 demodulates the digital sample signals ID and QD so as to form respective pulse signals IP and QP. The letter "P" signifies "pulse". Although the signals have been demodulated (broken down into IA and QA components), they were demodulated with a non-synchronous carrier. Since the demodulating carrier was not synchronized with the transmitted carrier, the constellation will still be rotating. It is typically called a Near Baseband Signal at this point. Once it has been derotated, it is referred to as a "Base-Band Signal". Thus the IBB and QBB nomenclature on the output of Derotator 1111-4. The baseband signals can be plotted on a I vs. Q plot which creates the "constellation" diagram. The baseband signal is input to slicer 111-2 which estimates which of the four constellation points was transmitted. Each of the IP and QP pulse signals contain a series of pulses corresponding to data bits. The data bits have either a logic low ("0") level or logic high ("1") level corresponding to 0° and 180° phase shifts, respectively, of the I and Q signals of the transmitted QPSK RF carrier. The IP and QP signal components are coupled to decoder 13, where the data bits are formatted into packets and forward error correction (FEC) performed.

CTL 1111 includes complex derotator 1111-4, slicer 1111-2, numerically controlled oscillator (NCO) 1111-1, phase detector 1111-3, and the loop filter 1111-5. Complex derotator 1111-4 is a complex multiplier that derotates the spinning constellation to output a stable constellation. The derotation is accomplished by multiplying the digital input ID and QD signals by the estimated sin and cosine of the estimated frequency offset and phase. The estimated frequency offset is the rate at which the near baseband signal is spinning. How this estimated offset is generated is described below.

Slicer 1111-2 takes the derotated constellation and outputs decisions based on the quadrant of the input. Each I, Q pair out of slicer 1111-2 is the estimate of which symbol was transmitted. Phase detector 1111-3 takes the input and output of slicer 1111-2 and generates a phase error signal for each symbol. This phase error signal is applied to loop filter 1111-5. Loop filter 111-5 controls NCO 1111-1 and provides an estimate of the offset frequency. This estimate is available to microprocessor 19.

A frequency error, for example, due to a LNB derived frequency offset of the selected RF signal, causes a so-called "rotation" or "spinning" of the position of the two-bit demodulated data of the QPSK signal with time. The direction of rotation is dependent on whether the frequency offset is positive or negative. As is shown in FIG. 2, the data constellation for QPSK modulation has four points corresponding to the four possible logic combinations (00, 01, 10 and 11) of the respective two possible logic levels represented by the two possible phase shift values of the I and Q signals. Phase detector 1111-3 measures the position of the demodulated data relative to the ideal position in the data constellation. To correct for data rotation and tilt, the frequency, and thus the phase, of NCO 1111-1 is changed by loop filter 1111-5 in response to the output signal of phase detector 1111-3 until the rotation stops and the tilt is eliminated.

With this rotation stopped, the constellation is stabilized and CTL 1111 is considered "locked." Under this steady state condition, loop filter 1111-5 has correctly estimated the frequency and phase shifts that are needed to derotate the date so that the constellation is successfully stabilized. Loop filter 1111-5 has a proportional and integral paths which are summed together to form the control for NCO 1111-1. The value of the integral path (which integrates the phase error) represents the frequency offset which cause the "rotation". This value is available to microprocessor 19 as the FREQUENCY signal shown in FIGS. 1 and 2. Microprocessor 19 compares successive samples of the FREQUENCY signal to determine if the constellation has been stabilized. If the difference in successive samples is small, the demodulation is recognized as "LOCKED". Under this steady state condition, the demodulated data IP and QP is reliable and passed on to FEC decoder 13. During the acquisition of a channel, if the current frequency of the tuner LO 911 does not allow a successful lock of CTL 1111, then the microprocessor 19 will adjust the frequency until either a LOCKED condition is found or a suitable frequency range has been covered. The entire signal acquisition process will be more fully detailed in the description of the flow chart in FIG. 3.

Within limits, CTL 1111 can demodulate the QPSK data even when the frequency of the IF signal, and therefore the frequency of the IA and QA signals, is incorrect or offset. However, if the frequency offset is too great, a portion of the frequency spectrum of the IF signal will fall outside of the passband of SAW filter 915 due to the shift of the IF signal relative to the center frequency of SAW filter 915. This will cause a degradation of the signal to noise ratio of the receiver. Accordingly, as noted above, microprocessor 19 monitors a FREQUENCY signal generated by CTL 1111 to indicate the frequency offset of the IF signal. As the frequency offset caused by the LNB drift changes, CTL 1111 tracks the changes and FREQUENCY signal monitored by microprocessor 19 is updated. Upon the next channel acquisition, microprocessor 19 will use the last recorded frequency offset to provide a more accurate placement of LO 911. This should allow the signal to be quickly acquired without having to search by moving LO 911 again. If the frequency offset becomes so large as to cause degradation in the reliability of the demodulated data, eventually, FEC decoder 13 will be unable to correct the errors and break lock. Microprocessor 19 will request a reacquisition of the same channel and the last frequency offset will again be used to accurately place LO 911 for a quick reacquisition.

As noted above, the derotated data streams, IP and QP are processed by FEC decoder 13 shown in FIG. 1. The function of FEC decoder 13 is to correct errors incurred in the transmission of the data. For the decoder to be able to correct errors, the demodulated signal must be stabilized. Additionally, in order to correct the data, FEC decoder 13 must be set for the same code rate as the transmission code rate and synchronized to the packet boundaries. The FEC LOCK signal generated by FEC decoder 13 and monitored by microprocessor 19 indicates if all the above conditions are met and FEC decoder 13 is successfully passing error free data. For example, the FEC LOCK signal has a low logic level when FEC decoder 13 cannot correct the data, and the FEC LOCK signal has a high logic level when FEC decoder 13 can correct the data.

The FEC LOCK signal is used as the final determination of whether tuner 9, QPSK demodulation 11, and FEC decoder 13 are successfully locked because CTL 1111 can falsely stabilize on a "false lock point". At a "false lock point", the constellation does not appear to be spinning. But the constellation is actually rotating 90 degrees (or a multiple of 90 degrees) per symbol. Since there is another constellation point 90 degrees away, it appears to be stable. The "false lock points" occur at multiples of the symbol rate divided by four. When CTL 1111 is stabilized at a false lock point, the FEC decoder will not be able to decode the data. Thus, the FEC LOCK signal will remain in a low logic level (unlocked).

The acquisition of signals which have been described so far only concern frequency offsets due to LNB frequency drifts. As noted above, frequency offsets may also be due to other reasons. More specifically, satellite transponder frequency adjustments may be made by the satellite transmission system operator to reduce the possibility of interference between carrier signals. By way of example, a transponder frequency may be changed by as much as +/−2 MHz. The transponder frequency adjustments cause the RF signals received from the LNB and the corresponding IF signal produced by the tuner to have a frequency offset. The following aspects of the present tuning system concern provisions for tuning frequency offsets due to the adjustment of individual transponder frequencies by the satellite transmission system operator. These provisions allow the transmission frequencies of the transponders to be adjusted by the satellite transmission system operator without unduly increasing the time for the indoor unit to acquire the digital signal when a new channel is selected.

Without the provisions for tuning frequency offsets due to the adjustment of individual transponder frequencies by the satellite transmission system operator, the tuning system operates in the following way when a new transponder frequency is selected.

The frequencies of the signals being transmitted are usually known before hand and stored in a table (referred to as the "baseline frequency" plan). Then during operation, when a transponder is selected for tuning, the baseline frequency is retrieved from the table and a frequency offset is added. This offset as previously described is determined from the offset required to lock up on the previous transponder. This offset is referred to as a "global offset" because it applies globally to all transponders. The cause of the global offset is due to any frequency drift in oscillators which are common to the communications path. For example, if the down converter oscillator in the LNB (Low Noise Block down converter) is off by 3 MHz due to it being a chilly night, then all the transponders will be shifted 3 MHz below their baseline frequencies. This global drift is initially found by a search algorithm which steps the tuner across a specified frequency range while trying to acquire the signal (referred to as the "find drift" algorithm). Once the find drift algorithm finds a signal, the exact offset of the signal can be used to initialize the global drift for future tuning. Once the global drift is initialized, the value is tracked by monitoring the FREQUENCY signal in CTL 1111. Every time a new transponder is requested, the microprocessor updates the global drift by adding the last value of the FREQUENCY signal.

With the normal system described above, if a transponder was moved from its baseline frequency plan, it would result in slow channel change times when tuning that transponder and any subsequently tuned trannsponder. This would be due to the fact that the above system assumes the offset is global to all transponders. For example, as for a system with 10 transponders, evenly spaced 30 MHz apart starting at 1000 MHz, the baseline frequency plan for the transponders would be the one shown in following TABLE 1. If the LNB offset causes a 2 MHz shift in the frequencies, the transponders are located at the frequencies shown in the "with LNB offset" column. If the satellite transmission system operator offsets transponder 3 from the others by 1.5 MHz, then the last column in TABLE 1 shows where each transponder is located.

TABLE 1

(Frequency Plan).

| Transponder Number | Baseline frequency | With LNB offset | Freq with # 3 moved and LNB offset |
|---|---|---|---|
| 1 | 1000 MHz | 1002 MHz | 1002 MHz |
| 2 | 1030 MHz | 1032 MHZ | 1032 MHz |
| 3 | 1060 MHz | 1062 MHz | 1060.5 MHz |
| 4 | 1090 MHz | 1092 MHz | 1092 MHz |
| 5 | 1120 MHz | 1122 MHz | 1122 MHz |
| 6 | 1150 MHz | 1152 MHz | 1152 MHz |
| 7 | 1180 MHz | 1182 MHz | 1182 MHz |
| 8 | 1210 MHZ | 1212 MHz | 1212 MHz |
| 9 | 1240 MHz | 1242 MHz | 1242 MHz |
| 10 | 1270 MHz | 1272 MHz | 1272 MHz |

With respect to the exemplary situation shown in the foregoing TABLE 1, the global drift would be initialized to 2 MHz if transponder 1 is selected. Since all transponders other than transponder 3 are correctly tuned, the tuner would be tuned to the desired signal. However, if transponder 3 is selected, the tuner would be tuned to the frequency 1.5 MHz higher than the one required and, therefore, the signal would not be acquired until the search algorithm began to widen its search by stepping LO 911. This would result in finding the signal, but at a new offset of 0.5 MHz. This new offset would be assumed to be the new global offset and would cause the next transponder to be selected being also mistuned. As a result, the tuner has to again go into the widened search. Therefore, every time transponder 3 is selected, an undesirably slower channel change occurs.

The present invention deals with the provisions for independent tuning frequency offsets due to the adjustment of individual transponder frequencies by the satellite transmission system operator. The following description is made with respect to FIG. 3.

Figure 3:
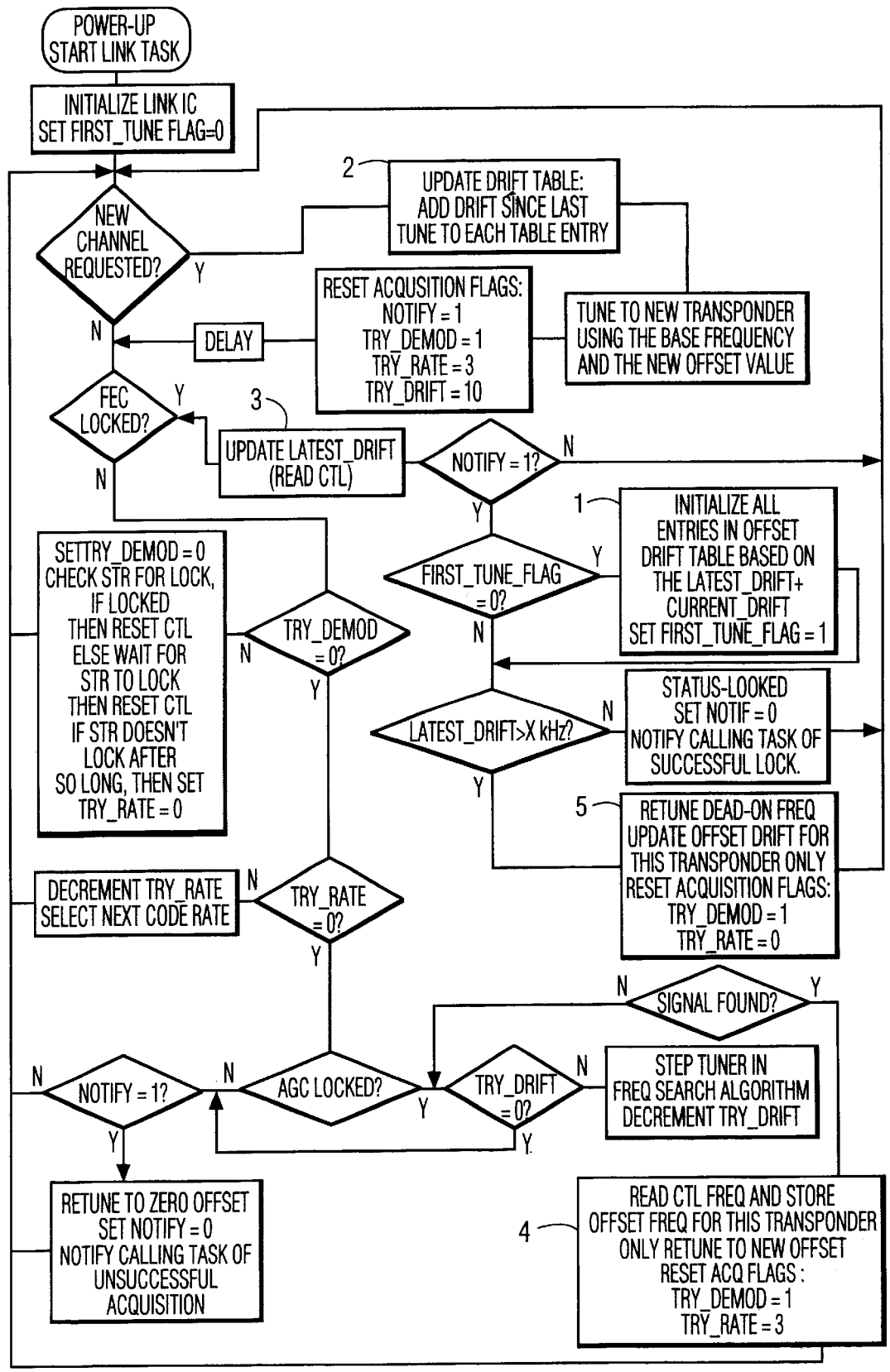
FIG. 3 is a flow chart of the acquisition routine used to control the tuning system shown in FIG. 1 in accordance with an aspect of the present invention.

The flow chart in FIG. 3 has five main scenarios that need to be described: (1) the maintenance mode (viewing a channel); (2) a normal channel change; (3) the transponder has been only slightly moved and does not require a broad search; (4) the transponder has been moved or is not at the offset or rate that was expected and does require a broad search; (5) the initial tuning of a transponder at start up of the box; and (6) an unsuccessful channel change.

(1) Maintenance mode. Steady state operation is when a user is viewing a channel and not surfing or experiencing any type of rain fade. Under this scenario, the following path would be taken: the "New Channel requested?" would be answered No. This would lead to the "FEC Locked?" (FEC—Forward Error Correction—locked means the decoder is successfully decoding the bitstream without errors) question, which would be answered Yes since everything is properly locked. In the box numbered 3, the FREQUENCY signal and the Carrier track loop (CTL) is read. This value is stored in the variable "Latest_drift" and represents the frequency drift that has occurred since the last tune (assuming the last tune put the tuner within one tuner step of the correct frequency). Since it is in steady state, the Notify flag will not be set (it is cleared after notification of a successful lock) and the routine returns to check if a channel change request has occurred and the cycle repeats.

(2) Normal Channel change. Under a normal channel change scenario, the new transponder that is to be acquired is within a tuner step of the expected frequency. The expected frequency is base frequency plus the offset stored in the drift table. The drift table contains the individual offset frequency for each transponder. The code follows the following path: the "New Channel Request" is answered Yes and executes the box numbered 2. Here the variable "Latest_drift" (last updated in the maintenance mode above) is added to each element of the drift table. This makes the assumption that the drift that has occurred on the previous transponder since the last tune is applicable to all transponders and is typically due to temperature and aging drift of the LNB LO (similar to the normal systems tracking of a global drift).

Next the tuner is commanded to the new transponder frequency which is the sum of the base frequency plus the newly updated offset frequency from the drift table. After the tune, the status flag is cleared, the acquisition flags are set including the notify flag. After a short delay, the FEC is queried for lock. The delay allows enough time for the FEC to lock if the tuner is properly placed and the correct code rate is selected. Under a normal channel change, the FEC will be locked at this point and the path will follow the Yes branch. The frequency offset is read again (and should be with in the incremental frequency step of the tuner LO under this scenario) and stored as Latest_drift. Now the Notify flag is checked and will follow the Yes path since it was just set. Then the First_tune_flag is checked and should not be set since it has previously been locked in this scenario. The value of Latest_drift is checked against a threshold which is approximately an incremental tuner step. Again, under this scenario, it is assumed that the offset is within the threshold and follows the No path.

At this point, the link is successfully locked and the routine notifies the software task that requested the channel change, that the link is ready. The Notify flag is cleared. The path then rejoins the maintenance path and will follow the maintenance cycle until another channel change is requested or a disturbance causes the FEC to break lock.

Notice in this path the acquisition flags are never used, because the acquisition was successful with out having to try anything or readjust anything.

(3) Channel change with minor adjustment to transponder frequency. Under this scenario, the transponder being acquired is close but not exactly where (in frequency) the drift table predicts. The frequency is close enough that the demodulation and FEC can still lock, but deemed to be far enough off that the individual transponder offset will be corrected in the drift table. The path followed is identical to the above (case 2) with the exception of the Latest_drift being outside the threshold. Therefore, the routine executes the box numbered 5.

Here, the value of Latest_drift is added to the new transponders entry in the drift table. Then this new offset is used to place the tuner exactly on the signal—center it in the IF SAW). To get to this point in the routine, the FEC must have been locked up and thus the code rate must have been correct and therefore the try_rate flag is set to zero. Since the tuner is being moved, the demodulation could have trouble and the try_demod flag is set to give it an extra chance if needed. The path returns to the top and will fall through to check the FEC lock. Under this scenario, the FEC should lock and this time follow the path of a normal channel change with the Latest_drift being within the threshold.

(4) Channel change with wide frequency search required. In this scenario, the transponder being acquired is far enough away from the predicted value that the algorithm must search for the signal by stepping the tuner. However, before the frequency search begins, the algorithm check for Symbol Timing Recovery (STR) loop lock, resets the Carrier track loop (CTL) in case it was in a false lock, and it checks each code rate for the FEC, and checks the AGC for stability to determine is there is a signal there to be acquired. If these corrective actions do not allow for a FEC lock, then the frequency search is conducted. This is a last resort because it is relatively time consuming. This is also the reason for the tracking of individual offsets for transponders, to avoid this time consuming search under normal channel change conditions.

The scenario starts off as a normal channel change, the drift table is updated in box 2, the tuner is tuned to the predicted frequency, flags are reset, but after the delay, the FEC is still not locked. At this point the corrective actions start. Following the No path out of the "FEC Locked" decision, the status flag is UNLOCKED, so the routine follows the No path. But the "try_demod" flag is set, so its not equal to zero and the routine clears the Try_demod flag, checks the symbol timing recovery (STR) for lock. The STR lock is evaluated by comparing consecutive reads of the STR loop filter and comparing to an allowable delta. When the STR is unlocked, the filter will be ramping and easily detected. If the STR is locked then the CTL (Carrier track loop) is reset to allow another chance at a clean lock.

If the STR is not locked, then it is periodically checked until it has been given enough time to ramp through all possible values. If it locks with in that time, then just as above, the CTL is reset. If the STR does not lock with in the time period, then the try rate flag is cleared (there is no use in trying the other code rates if the symbol timing can not lock ). The path returns to check for new channel change request and if none, then it checks to see if the corrective action was successful resulting in a FEC lock. If FEC is still unlocked, then the No path is again followed, but this time the "Try_demod" flag is clear, so it falls through to check the "Try_rate" flag. If the STR was locked then this flag will still be set and not equal zero. Thus the No path is followed and the Try_rate flag is decremented and the FEC code rate is changed to the next rate. In the example, the "try_rate" flag is initialized to 3, so three rates will be tried before falling through to the AGC check. After each rate, the routine returns to check for a new channel request or to see if the FEC locked.

Assuming neither occurs, the AGC is checked for lock. Again, lock is determined by comparing consecutive samples of the AGC loop filter. The AGC is checked for lock to speed up the customers installation. If there is no signal present, then the AGC will not lock, and there is no use in wasting time searching in frequency. For this scenario, the AGC should be locked and the "try_drift" variable will be checked. While the try_drift variable is still positive, the tuner will be stepped through a set of positions to cover a predetermined pattern. At each step, Try_drift will be decremented and the algorithm will check for STR and CTL lock ("signal found?").

First the STR is checked in a similar manner to that described above in the Try_demod portion. Once the STR is locked, the CTL is reset and checked for lock. Again the CTL lock is a determined by comparing the differentiation of the frequency indication from the loop filter to a fixed threshold. Unless both STR and CTL are declared locked within a certain time, the No path is followed and the next tuner location will be tried until either a signal is found or try_drift=0. If both STR and CTL are declared locked within the time allowed, then the signal is considered "found" and the Yes path is followed.

In the box numbered 4, the CTL frequency is summed with the tuner step position and that is stored in the drift table for that transponder. The tuner is retuned to this new offset and the acquisition flags are set to repeat the "try_demod" and the "try_ate" portions. After box 4, the routine returns to the top to again check for new channel request and to see if the FEC is locked. Once the correct frequency offset and rate are discovered, the FEC should lock and the rest of the normal channel change path is run.

The "try_drift" variable is initialized to 10 because there are 10 tuner positions (bands) that are searched. The frequencies that are searched allow for locating a signal that is offset by both the maximum LNB temperature and aging spec. and for the maximum individual transponder offset allowed of the uplink provider. As an example, the LNB is specified to be with in +/−5 MHz of the desired frequency and the uplink provider was allowed to shift individual transponder frequencies up to +/−2 MHz, so the algorithm searched +/−7 MHz.

(5) Upon initial tuning of a transponder. The scenario is similar to that of 4 in that the offset frequency of the transponder is unknown or incorrect. The only difference is that once the FEC is Locked, this time the "First_tune_flag" will be set and the box numbered 1 will be executed. In this stage, all entries in the drift table are initialized to the offset found for the first transponder. This includes the Latest_drift read in box 3 and the current_drift which is the value determined in box 4. Then the "First_tune_flag" is cleared so this initialization is not done again. The path then continues as a normal channel change.

(6) Unsuccessful acquisition. During an unsuccessful acquisition, all the Try_demod, try_rate, and Try_drift are eventually zeroed due to either trying that portion, or it being cleared due to another prerequisite. An example was mentioned in 4) above, when in Try-demod, if the STR doesn't lock then the try_rate is automatically zeroed. Thus once the routine has all the "try" variables zeroed and if the Notify flag is set, then the tuner is returned to zero offset for that transponder, the Notify flag is cleared and the software task that requested the transponder is notified of the unsuccessful acquisition. The routine will continue to cycle through checking for a new channel request and FEC lock.

The present invention deals specifically with how the frequency offsets for individual transponders are handled. In a normal system, only a single frequency offset is tracked or monitored and that offset is applied to all transponders equally. The present invention similarly tracks the frequency offset during viewing and applies that offset to all transponders, but keeps separate values for each transponder so that each transponder may be separately recorded if required. The above scenarios 3 and 4 are examples of when a transponder offset is individually adjusted. The key factor is when a transponder is acquired at a position other than the predicated offset, then only that transponder's offset is updated. It should also be noted that the present invention will only require the longer tune time for a transponder shifted from the base plan on the first acquisition of that transponder since it has been shifted. After that the offset should be recorded and quick channel changes will occur.

While the present invention has been described in terms of a specific embodiment, it will be appreciated that modifications may be made which will fall with in the scope of the invention.

What is claimed is:

1. A method of controlling a tuner (9) which receives a plurality of RF signals and which produces a carrier signal bearing information corresponding to a tuned one of said RF signals, said tuner (9) including a local oscillator (911) having a frequency controlled in accordance with digital tuning representative words to tune respective ones of said RF signals; said method comprising the steps of:

storing digital nominal frequency representative words for respective ones of said RF signals;

storing digital offset representative words for respective ones of said RF signals;

determining a frequency offset of said carrier signal after a RF signal has been tuned;

updating all of said digital offset representative words in accordance with said frequency offset of said carrier;

deriving the tuning representative word for an RF signal selected to be tuned by combining said nominal frequency representative word for said RF signal selected to be tuned with said previously updated offset representative word for said RF signal selected to be tuned; and updating the respective digital offset representative word for an individual RF signal presently being tuned if correct tuning is not achieved with the previously updated offset representative word.

2. The method recited in claim 1, wherein:
said digital offset representative word for an RF signal presently being tuned is updated if said frequency offset of said carrier exceeds a predetermined value.

3. The method recited in claim 1, wherein:
all of said digital offset representative words are updated in response to the selection of a new RF signal for tuning.

4. The method recited in claim 1, wherein:
said RF signals are associated with respective transponders of a satellite, are provided by a frequency conversion unit, and have frequencies with nominal values corresponding to respective nominal frequency representative words, but are susceptible of being offset from the nominal values due to drifts associated with one of the conversion unit and the tuner and shifts of a transmission frequency of a transponder.

5. The method recited in claim 4, wherein:
said carrier bears digitally encoded information which is processed by a digital processing section including an error correction unit; and
the respective digital offset representative word for an individual RF signal presently being tuned is updated if either said frequency offset of said carrier exceeds a predetermined value or proper error correction is not possible.

6. A method of controlling a tuner which receives a plurality of RF signals associated with respective transponders of a satellite and provided by a frequency conversion unit and which produces a carrier signal bearing information corresponding to a tuned one of said RF signals, said RF signals having frequencies with nominal values but being susceptible of being offset from the nominal values, said tuner including a local oscillator (911) having a frequency controlled in accordance with digital tuning representative digital words to tune one of said RF signals; said method comprising the steps of:

storing digital nominal frequency representative words corresponding to the nominal frequency values of respective ones of said RF signals;

storing digital offset representative words corresponding to respective ones of said RF signals;

when a RF is selected for tuning, combining the nominal frequency representative word and the offset representative word for said selected RF signal to derive said tuning word for said selected RF signal;

determining a frequency offset of said carrier signal; and updating said offset representative words for all of said RF signals in a first mode of operation and updating said frequency representative word for only said selected RF signal in a second mode of operation.

7. The method recited in claim 6, wherein:

the frequencies of said RF signals are susceptible of being offset from the nominal values due to (1) drifts associated with one of the frequency conversion unit and the tuner and (2) a shift of a transmission frequency of a transponder;

said first mode of operation pertains to offsets due to drifts associated with one of the frequency conversion unit; and said second mode of operation pertains to offsets due to a shift of the transmission frequency of a transponder.

8. Apparatus comprising:

a tuner (9) which receives a plurality of RF signals and which produces a carrier signal bearing information corresponding to a tuned one of said RF signals, said tuner (9) including a local oscillator (911) having a frequency controlled in accordance with digital tuning representative words to tune respective ones of said RF signals; and a controller (921, 923, 11, 19, 13) for controlling the frequency of said local oscillator (911); said controller storing digital nominal frequency representative words for respective ones of said RF signals, storing digital offset representative words for respective ones of said RF signals, determining a frequency offset of said carrier signal after a RF signal has been tuned, updating all of said digital offset representative words in accordance with said frequency offset of said carrier, deriving the tuning representative word for an RF signal selected to be tuned by combining said nominal frequency representative word for said RF signal selected to be tuned with said previously updated offset representative word for said RF signal selected to be tuned, and updating the respective digital offset representative word for an individual RF signal presently being tuned if correct tuning is not achieved with the previously updated offset representative word.

9. The apparatus recited in claim 8, wherein:

said controller (921, 923, 11, 19, 13) updates the offset representative word for an RF signal presently being tuned if said frequency offset of said carrier exceeds a predetermined value.

10. The apparatus recited in claim 8, wherein:

said controller (921, 923, 11, 19, 13) updates all of said digital offset representative words in response to the selection of a new RF signal for tuning.

11. The apparatus recited in claim 8, wherein:

said RF signals are associated with respective transponders of a satellite, are provided by a frequency conversion unit, and have frequencies with nominal values corresponding to respective nominal frequency representative words, but are susceptible of being offset from the nominal values due to drifts associated with one of the conversion unit and the tuner and shifts of a transmission frequency of a transponder.

12. The apparatus recited in claim 11, wherein:

said carrier bears digitally encoded information which is processed by a digital processing section including an error correction unit; and the respective digital offset representative word for an individual RF signal presently being tuned is updated if either said frequency offset of said carrier exceeds a predetermined value or proper error correction is not possible.

13. The apparatus recited in claim 8, wherein:

said local oscillator (911) is included in a phase locked loop (919) including a programmable divider having a division factor set in accordance with said tuning representative digital word for controlling the frequency of said local oscillator.

* * * * *